United States Patent [19]
Kato

[11] Patent Number: 5,352,325
[45] Date of Patent: Oct. 4, 1994

[54] METHOD OF FORMING THROUGH HOLES IN PRINTED WIRING BOARD SUBSTRATES

[75] Inventor: Yoji Kato, Chino, Japan

[73] Assignee: Eastern Co., Ltd., Chino, Japan

[21] Appl. No.: 98,637

[22] Filed: Jul. 28, 1993

[30] Foreign Application Priority Data

Apr. 30, 1993 [JP] Japan ................. 5-124736

[51] Int. Cl.$^5$ .................. B44C 1/22; B23F 1/00; B29C 37/00
[52] U.S. Cl. .................. 156/644; 156/637; 156/655; 156/656; 156/668; 156/902
[58] Field of Search ............... 156/630, 633, 634, 637, 156/638, 639, 644, 645, 655, 656, 659.1, 661.1, 901, 668, 902; 427/97; 29/856

[56] References Cited

U.S. PATENT DOCUMENTS

| | | | |
|---|---|---|---|
| 3,265,546 | 8/1966 | Medford | 156/644 X |
| 3,276,927 | 10/1966 | Medford | 156/644 X |
| 3,354,543 | 11/1967 | Lawrence et al. | 156/644 X |
| 4,501,638 | 2/1985 | Johnson | 156/644 |
| 5,227,013 | 7/1993 | Kumar | 156/644 |

*Primary Examiner*—William Powell
*Attorney, Agent, or Firm*—Dilworth & Barrese

[57] ABSTRACT

The present invention is a method of forming micro through holes in printed wiring board substrate materials by means of chemical etching.

In a typical printed wiring board substrate material consisting of a resinous dielectric base material, (which may or may not incorporate glass fibers), clad on both sides by a conductive layer, after the dielectric material in specific locations where through holes are to be formed is exposed by typical processes in which the conductor layer is selectively removed by etching, said exposed dielectric material is first softened, then removed by chemical etching involving several steps and procedures as well as a variety of chemical solutions, under vibratory agitation, forming through holes in said locations of 100 microns diameter or less.

Employing the method of the present invention it is possible to determine the position, size and shape of the through hole required and also by means of plating to connect the conductive layers through the dielectric forming micro plated through holes in printed wiring boards.

19 Claims, 5 Drawing Sheets

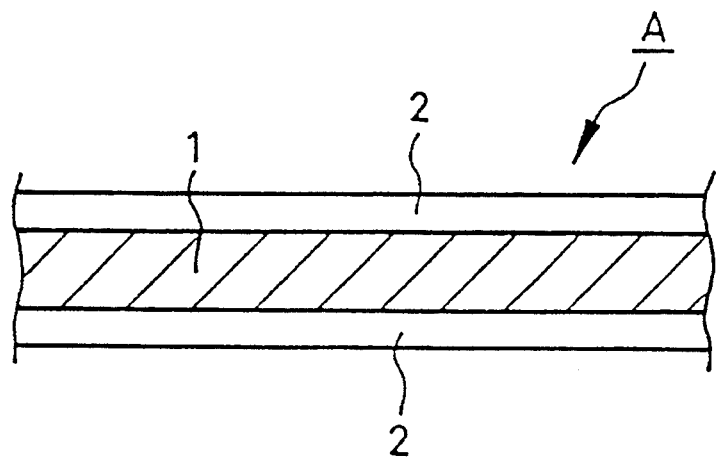
FIG_1
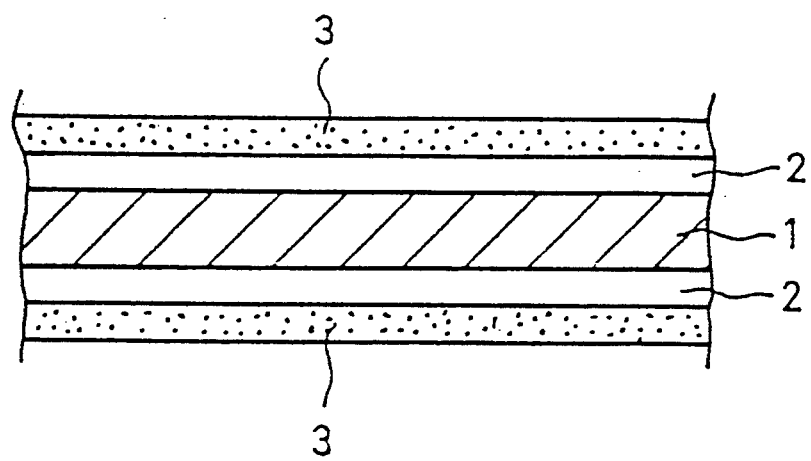
FIG_2

METHOD OF FORMING THROUGH HOLES IN PRINTED WIRING BOARD SUBSTRATES

BACKGROUND OF THE INVENTION

The present invention relates to a method of forming through holes in printed wiring board substrates; and more particularly to the formulation of micro through holes in the same accurately and effectively by means of a chemical etchant process.

Conventional methods of forming through holes in printed wiring boards heretofore employed include mechanical drilling, laser drilling and plasma etching among others.

Regarding mechanical drilling, it is very difficult to form micro through holes of 100 microns or less due to the difficulty in producing drills of that size that do not readily break. Also, even using a drill size of 250 microns it takes 5–6 hours to drill 10,000 holes an inordinate amount of time. Further, mechanical drilling created burrs, dust and debris that often block the holes or adhere to the surface of the substrate material requiring additional cleaning processes. Drilling apparatus required is very expensive and additional expendables like entry and back-up boards also add to cost.

Laser drilling and plasma drilling processes are incapable of forming holes in substrate materials containing glass fibers which disallows use of the most widely used and inexpensive substrates which normally do contain glass fibers. In addition, equipment to perform laser or plasma drilling is also very costly.

SUMMARY OF THE INVENTION

The inventor of the present process has developed a method of forming micro through holes in which holes are formed in the substrate material by selectively dissolving or etching away the resins forming the insulative core of the substrate using alkaline potassium permanganate in the case of material not containing glass fibers, and using fluoride chemicals, etc., in the case of material containing glass fibers, effectively and in a controlled manner forming micro through holes without resorting to mechanical drilling, laser drilling or plasma etching processes.

The aformentioned method in printed wiring board micro through hole formulation enables micro holes of 100 microns or less to be achieved.

In the method heretofore described, a printed wiring board substrate, consisting of an insulative layer (usually composed of resinous material with or without glass fiber reinforcement) covered on both sides with a conductive layer, is covered with an etching resist except for specified locations where holes are to be formed; a chemical etchant is brought into contact with said surfaces selectively dissolving the exposed parts of conductor layer; the previously applied etching resist is removed; the conductor surface is exposed to a strong alkaline solution and a solvent which softens the exposed areas of the insulative core material where holes are to be opened; the surface is then brought into contact with either alkaline potassium permanganate, concentrated sulfuric acid, chromate or similar solution under agitation selectively removing by chemical dissolution the resin core material exposed; this treatment is interrupted by bringing into contact with an acidic washing and neutralizing solution; the substrate is then exposed to a fluoride-added solution under agitation which dissolves the glass fibers completing the etching process and forming the micro through holes; metallization processes follow to form a conductive layer providing electrical interconnection between the conductive layers on both sides (plated through hole).

Using processes in the, aforedescribed method it is possible to precisely determine the exact size, shape and location of through holes.

BRIEF DESCRIPTION OF THE DRAWINGS

FIG. 1 is a cross sectional view of a typical printed wiring board substrate material such as referred to in the present invention.

FIG. 2 is a cross sectional view of said printed wiring board substrate wherein both surfaces are covered with etching resist.

DESCRIPTION OF THE PREFERRED EMBODIMENTS

Figure 3:
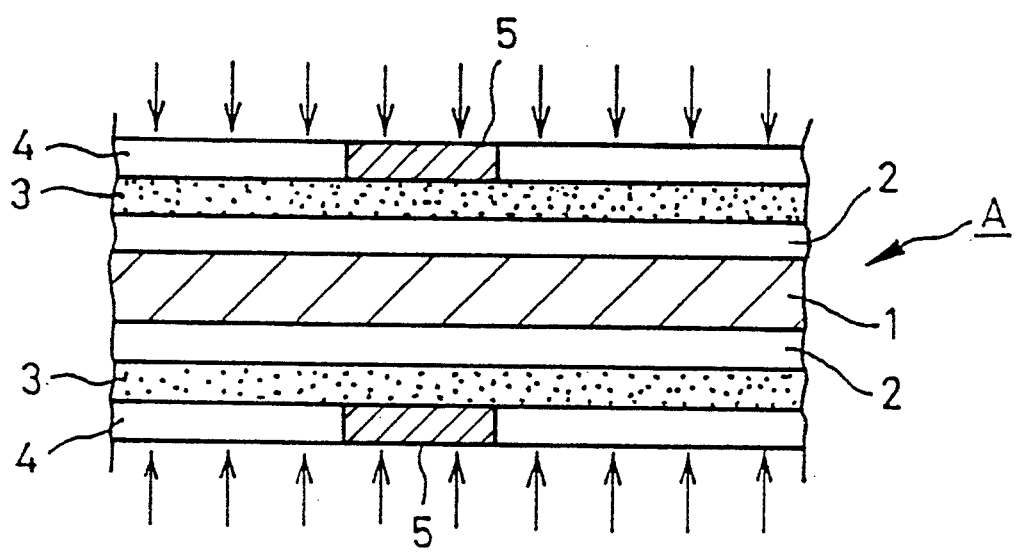
FIG. 3 is a cross section view of said substrate wherein pattern film is applied to the etching resist surface and exposed to UV rays.

Hereinafter, materials that may be used in the aforedescribed method and processes will be described and referenced to the attached drawings. Materials and chemicals used in the present invention include but are not limited to the following:

1. Printed wiring board substrate material:
   a) resinous dielectric materials such as epoxy, polyimide, BT resin denatured polyimide, etc. Also dielectric materials incorporating glass fibers in the aforementioned resinous materials.
   b) The aformentioned resinous materials being formed into a dielectric layer (1) of 25–100 microns thickness, preferably in the thickness range of 25–50 microns, a conductive layer of copper foil (2), preferably 9–18 microns in thickness, is formed or laminated on both surfaces of the dielectric layer (1).

2. Etching resist: By photographic means, the conductor layer (2) except the portion to be removed is coated with a dry film etching resist (3), or by means of printing, etching ink is applied as an etching resist (3).

3. Copper etchant: Copper etchant consisting of cupric chloride and ferric chloride is employed to dissove copper.

4. Solution for removing etching resist. Caustic potash aqueous solution is mainly used, but other solutions may be employed depending on etching resist employed.

5. Resin softening agent: A strong alkaline solution is used to soften the areas on the dielectric layer (1) to facilitate formulation of through holes in the next processes.

6. Solutions for removing resinous dielectric material: When an epoxy is used as the insulative layer (1) a solution of concentrated sulfuric acid or, alkaline potassium permanganate may be used. In the case of polyimide or BT resin of denatured polyimide being used as dielectric material, a chromate solution or alkaline potassium permanganate may be used. For purposes of environmental protection, use of alkaline potassium permanganate is suggested.

7. Solution for removing glass fiber: Fluoride solutions containing, for example borohydrofluoric acid may be used to dissolve glass fiber materials if contained in the dielectric core material (1).

EXAMPLE 1

A conductive layer (2) of 18 micron thick copper foil is applied to both surfaces of a dielectric layer (2) consisting of 25 micron thick polyimide film to form printed wiring board substrate material. (FIG. 1)

Next, as an etching resist (3) dry film (Dry Film A830 manufactured by Fuji Photo Film Co.,Ltd.) is applied to the surfaces of said conductor except in areas where micro through holes (5) are to be formed. (FIG. 2)

A pattern film (4) on which the pattern of the conductor to be formed is intimately applied to the surface of the etching resist. This pattern film prevents UV rays from reaching the etching resist where through holes are to be formed. (FIG. 3)

Figure 4:
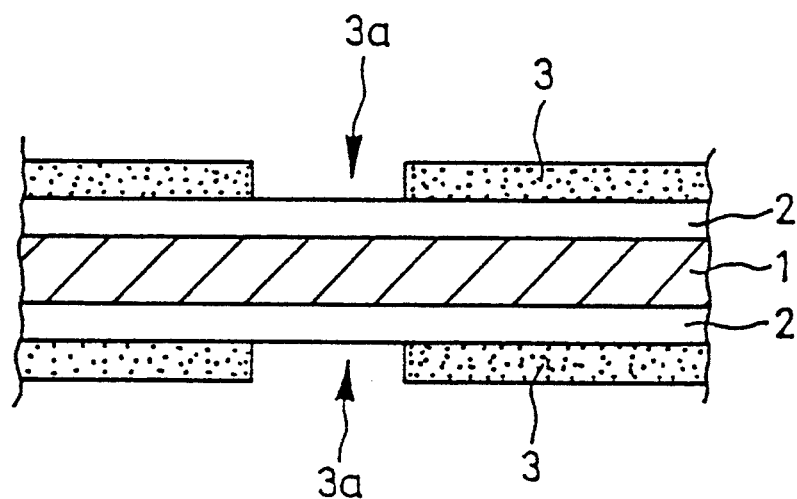
FIG. 4 is cross sectional view of same substrate wherein the pattern film is removed and the etching resist is selectively removed by development.

Both surfaces are exposed to UV rays via a projector. The pattern film is removed and the portions of the etching resist not exposed are removed in a developing process, forming openings (36) in the etching resist where through holes are to be formed. (FIG. 4)

Figure 5:
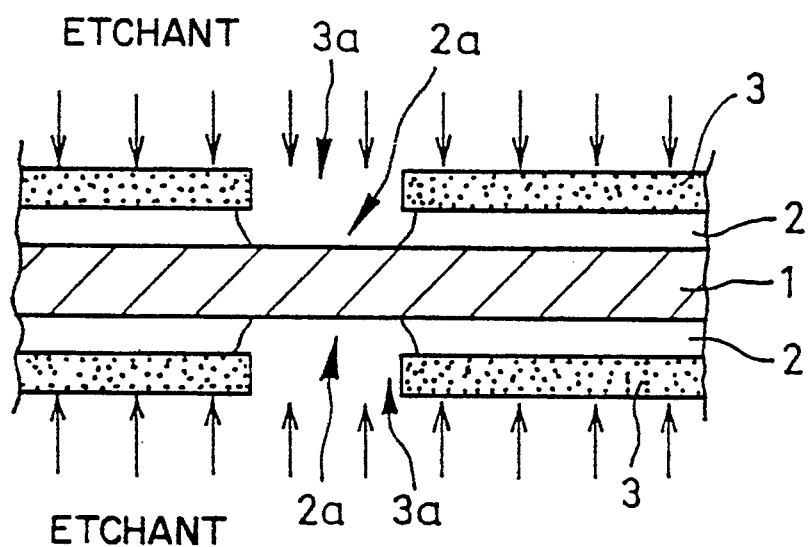
FIG. 5 is the same substrate wherein exposed conductive layer is removed by chemical etching.

Ferric chloride is brought into contact with areas not covered by etching resist subsequently dissolving the exposed copper to form openings (2a) in the conductive layer (2). (FIG. 5)

A micro through hole with a diameter of 100 microns on the pattern film (4) is formed in a concave shape (2a) with a diameter of 80 microns. Dimensional variation between design film diameter and that of actual product may occur due to variables like conductor layer thickness, concentration of etchant solution, etc.

Figure 6:
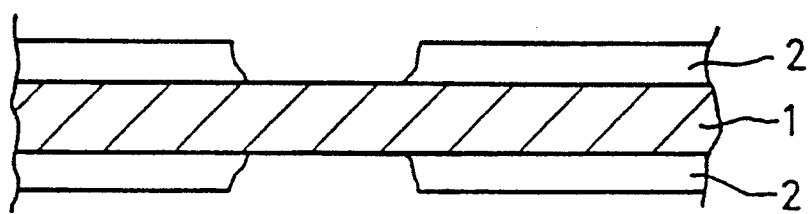
FIG. 6 is the same substrate wherein the etching resist is removed.

After the aforementioned etching of the dielectric layer where through holes are to be formed, the dry film etching resist is peeled off. (FIG. 6)

Figure 7:
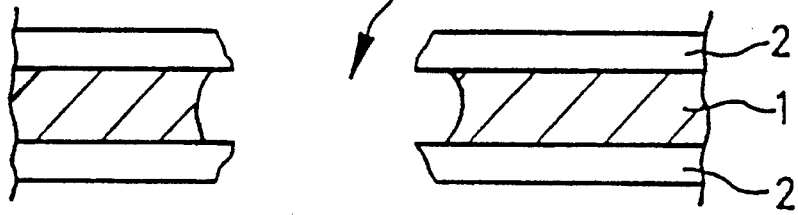
FIG. 7 is the same substrate in which the dielectric base material is removed by chemical etchant.

The dielectric core layer is thus exposed at the areas where through holes are to be formed. The remaining surrounding copper layer acts as etching resist except for these areas during the wet etching process in which the resins and glass fibers are removed chemically to form micro through holes (6). (FIG. 7)

Figure 9:
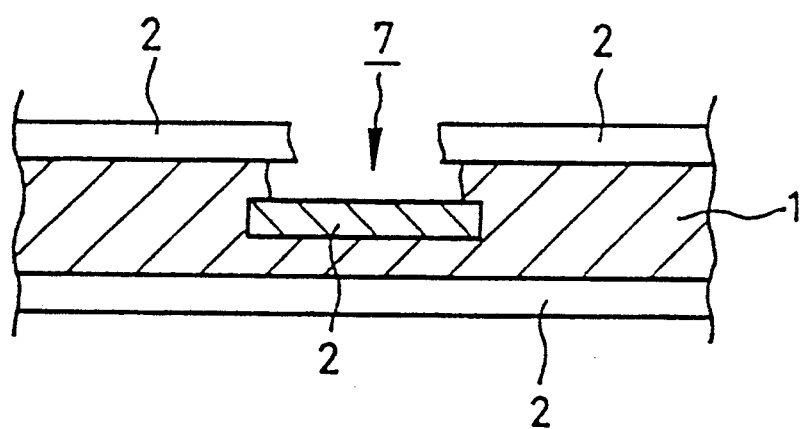
FIG. 9 is a cross section of said substrate wherein the hole formed leads to a conductive layer within the core from the surface of the outer conductive layer as another application of the present invention. (blind hole).

The hole formed may not necessarily be a through hole but only a concave depression (7) like a blind hole. (FIG. 9)

Figure 10:
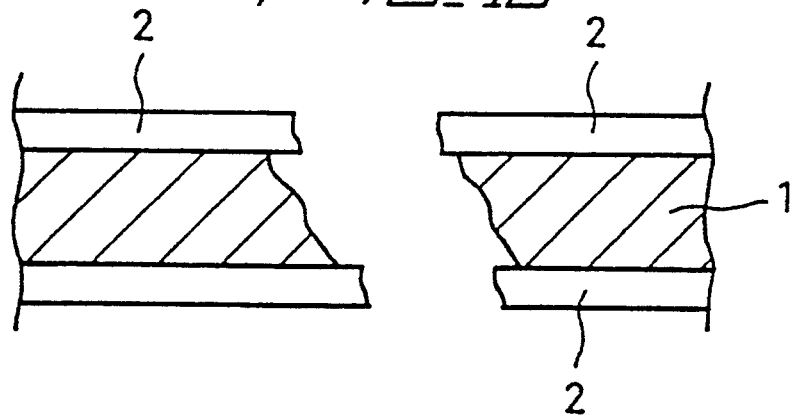
FIG. 10 is a cross sectional view of the same substrate wherein the hole has been formed at an oblique angle in reference to the substrate as another application of the present invention.

Furthermore, the through hole thus formed may be vertical in relation to the plane of the substrate, or may be formed obliquely as in FIG. 10. This technique is especially useful, for example, when design necessitates having conductor wire on one side of the board in the location of the through hole.

Moreover, the planar configuration of the through hole is not limited to the circular, and any configuration may be formed.

Details of the process used to dissolve the dielectric layer forming the through holes is as follows:

The process of pre-softening the dielectric material in the areas in which through holes are to be formed (5) is accomplished by exposure of same areas to a chemical agent named MLB Process-495 (manufacured in Japan by Japan Meltex, Inc.).

The process of etching out the pre-softened area (5) by dissolving the resinous base material forming the dielectric core is achieved by exposure of same areas to a chemical agent named MLB Process-497 (manufactured by Japan Meltex, Inc.),the principle ingredient of which is alkaline potassium permanganate.

The process for removing the residue of the etching agent MLB Process-497 is an acidic plastic cleaning agent named MLB Process-498 (manufactured by Japan Meltex, Inc.).

Using the aforementioned materials in the heretofore described method, micro through hole forming process was carried out under the following conditions:

| MLB Process-495 | 75 | 30 minutes |
| MLB Process-497 | 85 | 45 minutes |
| MLB Process-498 | 60 | 10 minutes |

(The above processes were carried out in an immersion tank under vibratory agitation, oscillation frequency of 22–40 Hz)

The above process resulted in the formation of throughholes (6) of 80 microns in diameter. (FIG. 7)

Figure 8:
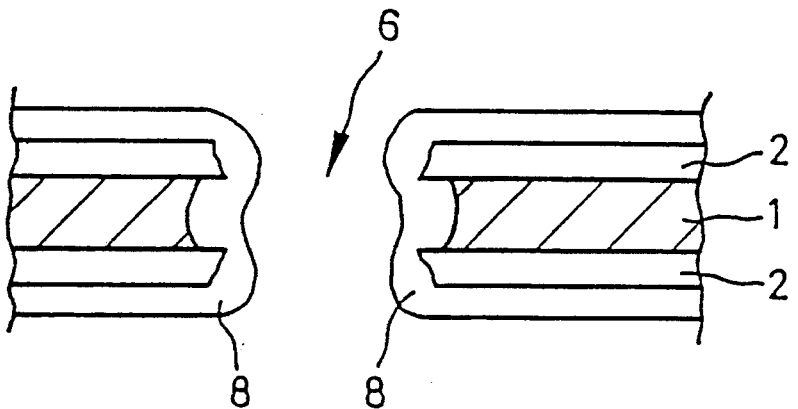
FIG. 8 is the same substrate in which the through hole is plated with copper (plated through hole).

Copper plating of 12.5 microns thickness (8) was applied to the surface of the inner wall of the through hole (6). (FIG. 8)

EXAMPLE 2

A conductive layer (2) of 18 microns thick copper foil is applied to both surfaces of an insulative layer (2) consisting of a 50 microns thick glass fiber reinforced epoxy resin sheet to form printed wiring board substrate material.

Next, as an etching resist (3) dry film (Dry Film A830 by Fuji Photo Film Co. Ltd.) is applied to the surfaces of said conductor except in areas where micro through holes are to be formed.

A pattern film on which the pattern of the conductor to be formed is intimately applied to the surface of the etching resist. This pattern film prevents UV rays from reaching the etching resist where where through holes are to be formed. (FIG. 3)

Both surfaces are exposed to UV rays via a projector. The pattern film is removed and the portions of the etching resist not exposed are removed in a developing process, forming openings (3a) in the etching resist where through holes are to be formed. (FIG. 4)

Ferric chloride is brought into contact with areas not covered by etching resist subsequently dissolving the exposed copper to form openings (2a) in the dielectric layer (2). (FIG. 5)

A micro through hole with a diameter of 100 microns indicated on the pattern film (4) is thus formed in a concave shape (2a) with a diameter of 80 microns. Dimensional variation between the diameter on the pattern film and that of the actual product may occur due to variables like dielectric layer thickness, concentration of etchant solution, etc.

After the aforementioned etching of the conductive layer where through holes are to be formed, the dry film etching resist is peeled off. (FIG. 6)

The dielectric core layer is thus exposed at the areas where through holes are to be formed. The remaining surrounding copper layer acts as etching resist except for these areas during the wet etching process in which the resins and glass fibers are removed chemically to form micro through holes (6). (FIG. 7)

The configuration and construction of said micro through holes are the same as in Example 1.

Next, the etching of micro through holes in the dielectric material is performed using the chemicals described in Example 1, and others, that is:

Pre-softening the exposed dielectric material where holes are to be formed (5) using MLB Process-495.

The process of etching out the pre-softened areas (5) by dissolving the resinous base material forming the dielectric core by exposing same to MLB Process-497.

The process for etching out the glass fibers by exposing the same to MLB Process-498 to which has been added another solution named Glass Etching Additive (manufactured by Japan Meltex, Inc.), the main active ingredient of which is borohydrofluoric acid. Thus the neutralizing and cleaning of residues from etching in which MLB Process-497 was used is accomplished by the MLB Process-498 solution, and the added borohydrofluoric acid based Glass Etching Additive removes the glass fibers by dissolution.

Using the aformentioned materials in the heretofore described method, micro through hole formation was carried out under the following conditions:

| | | |
|---|---|---|
| 1. MLB Process-495 | 80–85 C. | 10 minutes |
| 2. MLB Process-497 | 83–88 C. | 25 minutes |
| 3. MLB Process-498 with Glass Etching Additive | 60–65 C. | 15 minutes |

Glass Etching Additive (The above processes were carried out in an immersion tank under vibratory agitation at an oscillation frequency of 22–40 Hz)

The above wet etching processes may be carried out as one step processes, or, depending on the construction, thickness, etc., of the substrate, may require being carried out in 2 or more steps.

Regarding the application of vibration or agitation during the aforementioned processes, in order to be effective, fresh dissolving solution must come into contact with the resin or glass fibres constantly. Regarding the condition of being under vibration or agitation, this means that the immersion tank itself is caused to vibrate, thus ensuring a continuous movement of the etchant solutions against the substrate. However, the same results may be obtained using other means such as circulation pumps, spraying, etc.

Using the methods described in Example 2, micro through holes of 80 microns diameter were acheived. Copper plating with a thickness of 12.5 microns was applied to the inner hole walls, thus creating plated through holes The finished hole diameter of 80 microns was in accord with the design as represented on the pattern film.

Using the methods herein described, it is possible to accurately place and form through holes of 100 microns or less, and further possible to thereby reduce the needed land diameter. Thereby the pattern density of a printed wiring board can be increased two or three times compared to those achievable by conventional mechanical drilling.

Also, using the method described herein, it is possible to process the opening of micro through holes in printed wiring boards at a rate five to ten times faster than that which can be accomplished using conventional mechanical drilling processes.

The method of the present invention can be applied to substrates containing glass fibers, whereas plasma etching or laser drilling cannot.

In addition, equipment for implementing the present process costs one tenth or less than equipment necessary for plasma or laser micro through hole technologies.

What is claimed is:

1. In a printed wiring board substrate material consisting of a conductive layer applied to both surfaces of a dielectric resinous base material, a method of forming through holes in said substrate material comprising a covering process for covering said conductive layer with an etching resist, leaving open positions where a hole is to be formed into the surfaces of said layer, a removing process for selectively removing the conductive layer only at positions where holes are to be formed by bringing etchant into contact with said surfaces, a removing process for removing the etching resist, a softening process for softening the dielectric base material at positions where exposed by removal of the conductive layer, i.e., at positions where a hole is to be formed, by employing a strong alkaline agent and solvent solution, a removing process under vibratory agitation for dissolving the softened dielectric material to form holes employing alkaline potassium permanganate, or concentrated sulfuric acid, or chromate liquid, and a plating process for plating the surface of the inner walls of the hole forming a conductive layer electrically connecting the conductive layers (plated through hole).

2. In a printed wiring board substrate material consisting of a conductive layer applied to both surfaces of a dielectric resinous base material which contains glass fibers, a method of forming through holes in said substrate material comprising a covering process for covering said conductive layer with an etching resist, leaving open positions where a hole is to be formed into the surfaces of said layer, a removing process for selectively removing the conductive layer only at positions where holes are to be formed by bringing etchant into contact with said surfaces, a removing process for removing the etching resist, a softening process for softening the dielectric base material at positions where exposed by removal of the conductive layer, i.e., at positions where a hole is to be formed, by employing a strong alkaline agent and solvent solution, a removing process under vibratory agitation for dissolving the softened dielectric material to form holes employing alkaline potassium permanganate, or concentrated sulfuric acid, or chromate liquid, a process for neutralizing and washing away said solutions by employing an acidic solution, a removing process under vibratory agitation for dissolving glass fibers in the area where holes are to be formed, employing glass fiber dissolving fluid to which fluorine has been added, and a plating process for plating the surface of the inner walls of the hole forming a conductive layer electrically connecting the conductive layers (plate d through hole).

3. A method of forming a hole in a printed wiring board substrate material consisting of a conductive layer applied to both surfaces of a dielectric resinous base material, comprising a covering process for covering said conductive layer with an etching resist, leaving open positions where a hole is to be formed into the surfaces of said layer, a removing process for selectively removing the conductive layer only at positions where holes are to be formed by bringing etchant into contact with said surfaces, a process for removing the etching resist, a softening process for softening the dielectric base material at positions where exposed by removal of the conductive layer, i.e., at positions where a hole is to be formed, by employing a strong alkaline agent and solvent solution, and a removing process under vibratory agitation for dissolving the softened dielectric material to form holes employing alkaline potassium permanganate, or concentrated sulfuric acid, or chromate liquid, wherein the hole formed leads to an inner layer and penetrates from the outer surface to the conductive surface of the inner layer (blind whole).

4. The method of forming a hole in a printed wiring board substrate according to claims 1, 2 or 3, wherein the processes described are carried out in one or more steps.

5. The method of forming a hole in a printed wiring board substrate according to claims 1, 2 or 3, wherein the hole thus formed is oblique in relation to the base material.

6. The method according to claim 3, wherein the dielectric resinous base material contains glass fibers, additionally comprising a process for neutralizing and washing away said solutions by employing an acidic solution, and a removing process under vibratory agitation for dissolving glass fibers in the area where holes are to be formed, employing glass fiber dissolving fluid to which fluorine has been added.

7. The method of forming a hole in a printed wiring board substrate according to claim 6, wherein the processes described are carried out in one or more steps.

8. The method of forming a hole in a printed wiring board substrate according to claim 4, wherein the hole thus formed is oblique in relation to the base material.

9. The method of forming a hole in a printed wiring board substrate according to claim 6, wherein the hole thus formed is oblique in relation to the base material.

10. The method according to claim 3, additionally comprising a plating process for plating the surface of the inner walls of the hole forming a conductive layer electrically connecting the conductive layers (plated blind hole).

11. The method according to claim 6, additionally comprising a plating process for plating the surface of the inner wall of the hole forming a conductive layer electrically connecting the conductive layers (plated blind hole).

12. The method according to claim 1, additionally comprising covering said etching resist with a pattern film, and exposing said substrate to ultraviolet rays, whereby the pattern film prevents ultraviolet rays from reaching the etching resist where holes are to be formed.

13. The method according to claim 2, additionally comprising covering said etching resist with a pattern film, and exposing said substrate to ultraviolet rays, whereby the pattern film prevents ultraviolet rays from reaching the etching resist where holes are to be formed.

14. The method according to claim 1, wherein holes of 100 microns or less in size are formed in the printed wiring board substrate.

15. The method according to claim 2, wherein holes of 100 microns or less in size are formed in the printed wiring board substrate.

16. The method according to claim 3, wherein holes of 100 microns or less in size are formed in the printed wiring board substrate.

17. The method according to claim 6, wherein holes of 100 microns or less in size are formed in the printed wiring board substrate.

18. The method according to claim 1, wherein the etching resist is removed by dissolution.

19. The method according to claim 2, wherein the etching resist is removed by dissolution.

* * * * *